(12) United States Patent
Pehlke

(10) Patent No.: US 6,614,309 B1
(45) Date of Patent: Sep. 2, 2003

(54) DYNAMIC BIAS CONTROLLER FOR POWER AMPLIFIER CIRCUITS

(75) Inventor: David R. Pehlke, Chapel Hill, NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 10/080,225

(22) Filed: Feb. 21, 2002

(51) Int. Cl.[7] .................................................. H03F 3/04
(52) U.S. Cl. ..................... 330/296; 330/297; 330/298
(58) Field of Search ............................. 330/285, 296, 330/297, 298, 207 P

(56) References Cited

U.S. PATENT DOCUMENTS

| 6,137,354 | A | * | 10/2000 | Dacus et al. ................ 330/51 |
| 6,400,228 | B1 | * | 6/2002 | Verbist et al. ............... 330/297 |
| 6,509,722 | B2 | * | 1/2003 | Lopata ...................... 323/280 |

OTHER PUBLICATIONS

Publication No. 2002/0137480; System and Method for Current–Mode Amplitude Modulation; Sep. 26, 2002; Hadjichristos et al; 21 pgs.; Ser. No. 09/813,593.

Publication No. 2002/0136325; System and Method for RF Signal Amplification; Sep. 26, 2002; Pehlke et al.; 21 pgs.; Ser. No. 09/813,741.

Publication No. 2002/0077066; System and Method of RF Power Amplification; Jun. 20, 2002; Pehlke et al.; 17 pgs.; Ser. No. 09/738,971.

Patent application with Drawings for Current Modulator With Dynamic Impedance Compensation; Feb. 21, 2002; Pehlke, Hadjichristos & Camp; 49 pgs.; Ser. No. 10/080, 239.

* cited by examiner

*Primary Examiner*—Henry Choe
(74) *Attorney, Agent, or Firm*—Coats & Bennett, P.L.L.C.

(57) ABSTRACT

A bias controller sets the quiescent current of a power amplifier to a desired value by dynamically adjusting the power amplifier bias voltage. Using closed-loop control, the bias controller sets the bias voltage to whatever value is needed despite circuit component variations and temperature effects. Operation of the bias controller complements dynamic bias voltage adjustment in advance of transmit operations, such as in advance of a transmit burst. In a first state, where the power amplifier is in a quiescent condition, the bias controller adjusts bias voltage to set the desired quiescent current by detecting the supply current into the power amplifier. The bias controller then transitions to a second state, where it maintains the adjusted bias voltage irrespective of amplifier supply current. Despite its ability to sense supply current into the power amplifier, the bias controller's configurations avoid dissipative current sensing during normal operation of the power amplifier.

58 Claims, 12 Drawing Sheets

DYNAMIC BIAS CONTROLLER FOR POWER AMPLIFIER CIRCUITS

BACKGROUND OF THE INVENTION

Wireless communication devices are an integral part of modern existence, with a wide range of different device types in use, including, but not limited to, cellular telephones, portable digital assistants, wireless-enabled computers, and other so-called "pervasive computing" devices. While the use and capability of these devices vary considerably, each includes one or more of the fundamental building blocks comprising essentially any wireless communication device.

For example, any wireless device capable of transmitting a radio frequency (RF) signal includes some form of transmitter circuit to transmit a RF signal in accordance with a defined modulation scheme. Power amplification is a fundamental part of this signal transmission capability. Typically, the desired transmit signal is formed at a relatively low power level, and this pre-amplified signal is then amplified by a RF power amplifier, which boosts the signal power to a level suitable for radio transmission. Oftentimes, the level of transmit power is tightly controlled, such as in cellular telephony.

Controlling the output power of a RF power amplifier requires accurate control of the amplifier's bias voltage. That is, essentially all power amplifier circuits are implemented as transistor-based amplifiers, whether single- or multi-stage, and control of output power from these transistor-based amplifiers requires accurate control of transistor operating points.

Generally, an applied bias voltage establishes the operating point of a power amplifier. Indeed, operating point control affects whether the transistor operates in a linear or in a saturated mode, and greatly affects the amplification efficiency of the power amplifier, which is a dominant influence on battery life in portable wireless devices. Nominally, a given magnitude of bias voltage corresponds to a given level of quiescent current in the power amplifier, which current is determinative in setting the eventual output power of the power amplifier when stimulated with an RF source at its input. Ideally, one would simply set the bias voltage to the nominal level corresponding to the desired quiescent current. Unfortunately, a host of variables, including semiconductor process variations, temperature, aging, operating voltages, and others conspire to alter the relationship between a given bias voltage and the resultant amplifier quiescent current. In other words, one cannot simply choose the bias voltage that should result in the desired quiescent current; instead, one generally needs to adopt some form of bias voltage calibration or adjustment.

Of course, these calibration approaches add expense and complication, particularly on the manufacturing side where, in some cases, individual power amplifier circuits (or whole communication devices) are characterized over temperature and voltage to determine appropriate adjustment factors for bias voltage. This calibration information generally is then loaded into non-volatile memory within the calibrated devices for use in later operation.

BRIEF SUMMARY OF THE INVENTION

The present invention provides a method and apparatus for dynamically calibrating voltage bias into a power amplifier circuit in advance of transmit operations to ensure that the power amplifier circuit is biased to a desired quiescent current level. Although subject to implementation variations in many different embodiments, the present invention generally provides a bias controller that uses closed-loop control techniques to adjust a generated bias voltage up or down to make the supply current into the power amplifier circuit under quiescent conditions substantially match the target quiescent current value.

A timing function, which may be included in the bias controller, controls first and second operating states for the bias controller. During the first operating state, the bias controller adjusts bias voltage under closed-loop control based on measured or detected supply current into the power amplifier circuit. Thus, during the first state, the bias controller uses closed-loop control to adjust the bias voltage to whatever level is needed to achieve the target level of quiescent current. After some defined duration, the bias controller transitions from its first state to its second state, at which point it locks or otherwise holds the adjusted level of bias voltage irrespective of any changes in the supply current into the power amplifier circuit.

In operation, the first state is made to occur during quiescent conditions of the power amplifier circuit, such as before a radio transmit burst. As the bias controller transitions from its first to its second state, it locks or holds the adjusted bias voltage and maintains this bias voltage value through any subsequent radio transmissions.

In some exemplary embodiments, the bias controller is configured with a measurement path for measuring supply current into the power amplifier circuit that is independent of the primary path that provides supply current to the power amplifier circuit during transmit operations. In this manner, the bias controller avoids loading the primary supply path with any current measurement devices it might use to sense supply current into the power amplifier during bias voltage adjustment operations.

In other exemplary embodiments, the bias controller may use a reference current that has some defined proportionality to the actual supply current. Such reference currents are sometimes used in current modulators used in envelope-elimination-and-restoration (EER) applications. In EER systems, which are also referred to as "polar" modulation systems, the power amplifier is biased for saturated mode operation. A constant-envelope, phase-modulated signal is applied to the amplification input of the power amplifier, while its supply terminal is supplied with amplitude modulated supply voltage and/or current. Where current modulation is used, the bias controller may use a reference current generated as a scaled reference of the modulated supply current.

With this approach, the bias voltage adjustment control loop may be closed based on sensing the reference current rather than the actual current. Again, this approach avoids placing dissipative components in the supply current path of the power amplifier. During its first state of operation, amplitude modulation of the supply and reference currents is suspended, and no RF signal is applied to the power amplifier. The bias controller may include switching elements for isolating the current modulator from any input modulation signals to force this quiescent condition during the bias controller's adjustment operations.

Regardless of the its particular implementation, the bias controller's closed-loop adjustment approach accommodates variations in the relationship between supplied bias voltage and resultant quiescent current, thereby eliminating the need for stored calibration information, and any temperature- or voltage-based bias adjustment tracking.

That is, with the bias controller of the present invention, the bias voltage is adjusted under closed-loop control to whatever value is needed to fix the quiescent supply current of the power amplifier circuit at the target value.

Generally, the bias controller includes accommodations to ensure that the supply voltage applied to the power amplifier circuit during its bias voltage adjustment operations is of sufficient magnitude to reliably set the quiescent current level. That is, with some amplifier types, such as with bipolar junction transistor amplifiers, an adequate voltage between the collector and emitter, is required to reliably set the quiescent current level. Field effect transistors (FETs) typically have corresponding drain-to-source voltage ranges that should be maintained while setting bias voltage. Further, the bias controller operates to ensure that any voltage differences between the first state (adjustment) and the second state (transmit operations) are not so substantial that errors would result in the quiescent current level between the two operating states.

BRIEF DESCRIPTION OF THE DRAWINGS

FIG. 7A is a diagram of exemplary details for the bias controller and current modulator of FIG. 6, while

DETAILED DESCRIPTION OF THE INVENTION

Figure 1:
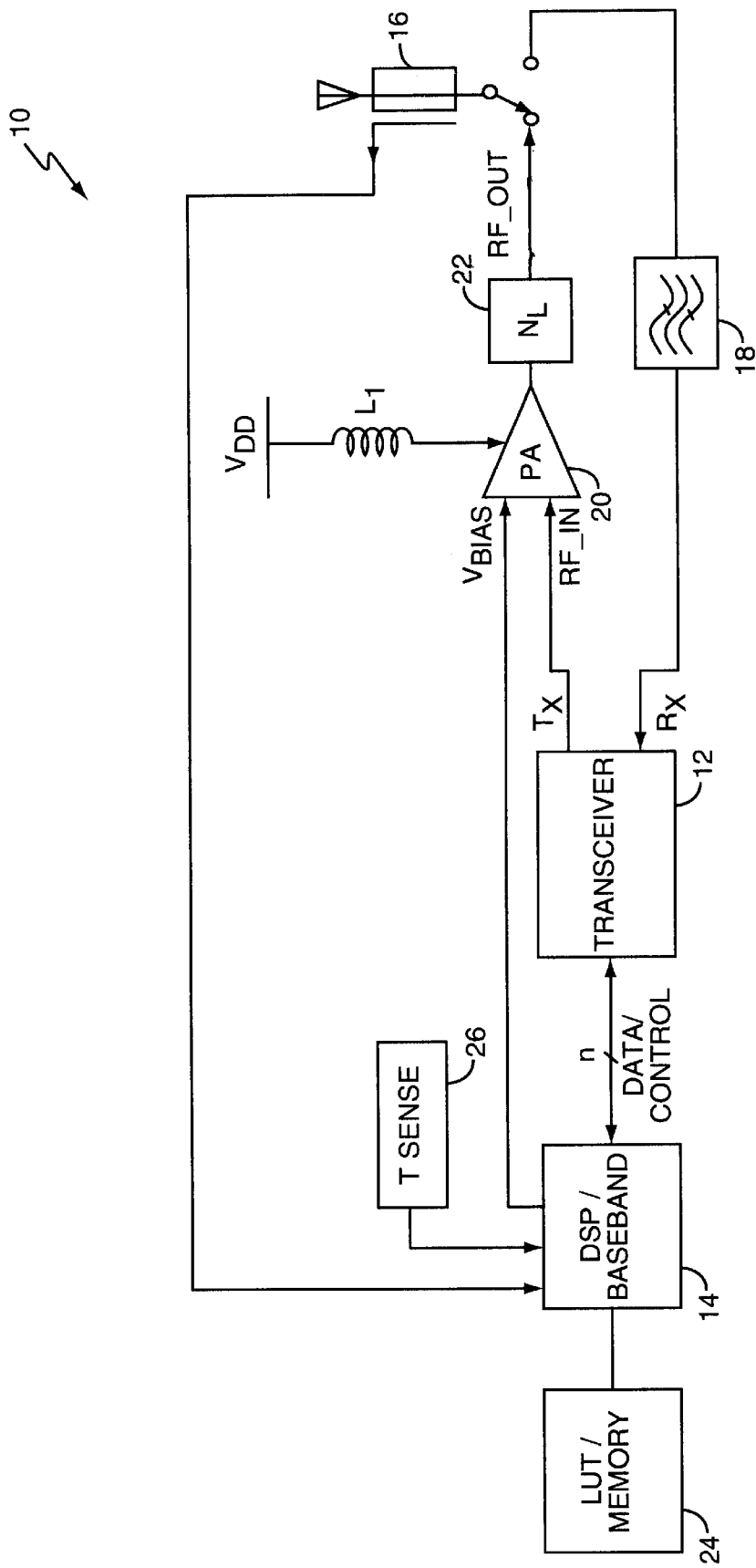
FIG. 1 is a diagram of a conventional wireless communication device employing stored calibration information to effect amplifier bias voltage control.

FIG. 1 illustrates an approach to power amplifier biasing as might be used in a conventional wireless communication device 10. The device 10 comprises a transceiver 12, which cooperates with a digital signal processor (DSP) 14 to process a received signal from an antenna assembly 16 after filtering and conditioning by a filter circuit 18. The transceiver 12 also cooperates with the DSP 14 to produce a transmit signal which is input to a power amplifier 20. Amplification of the transmit signal by the power amplifier 20 generates an RF output signal suitable for transmission by antenna assembly 16. An impedance matching circuit 22 may be used to couple the RF output signal from the power amplifier 20 to the antenna assembly 16.

Figure 2:
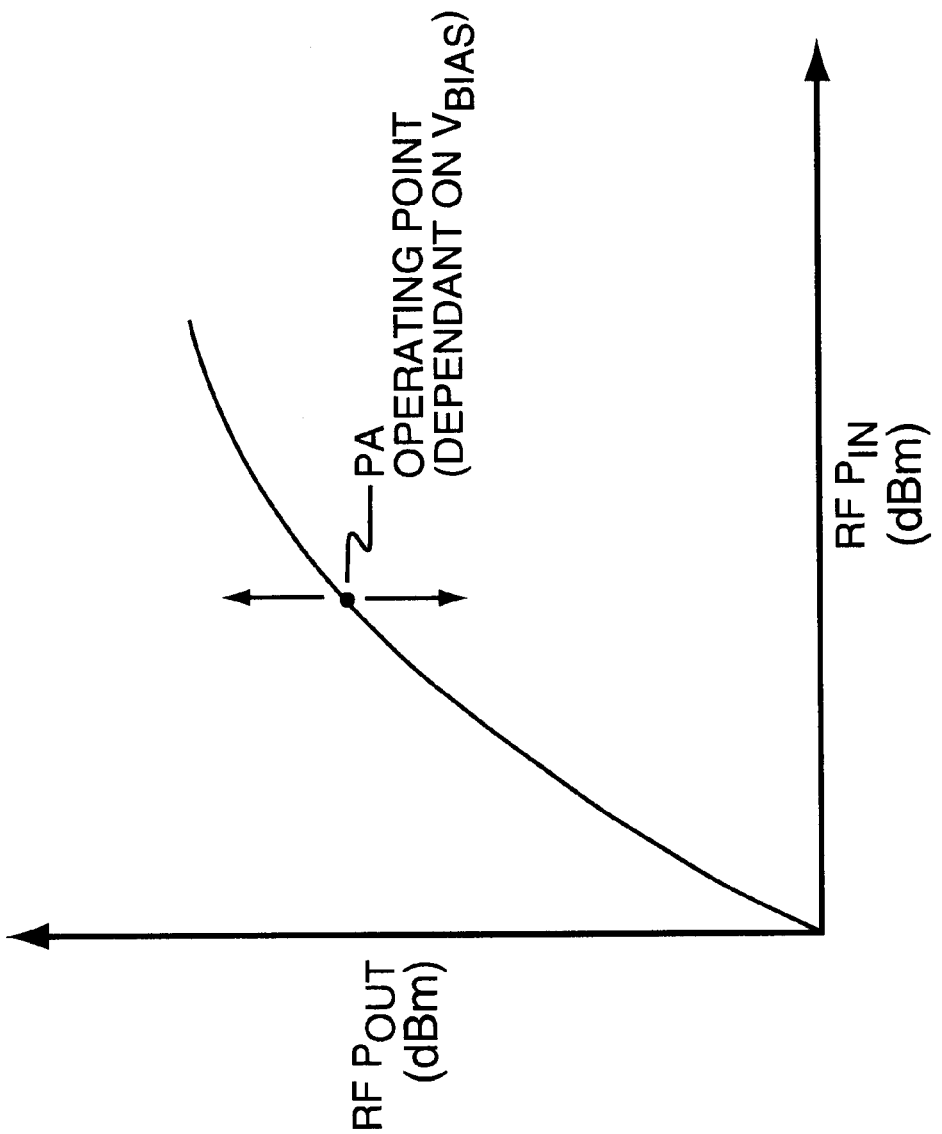
FIG. 2 is a graph illustrating the generalized relationship between transistor amplifier operating point and input/output RF power.
Figure 3:
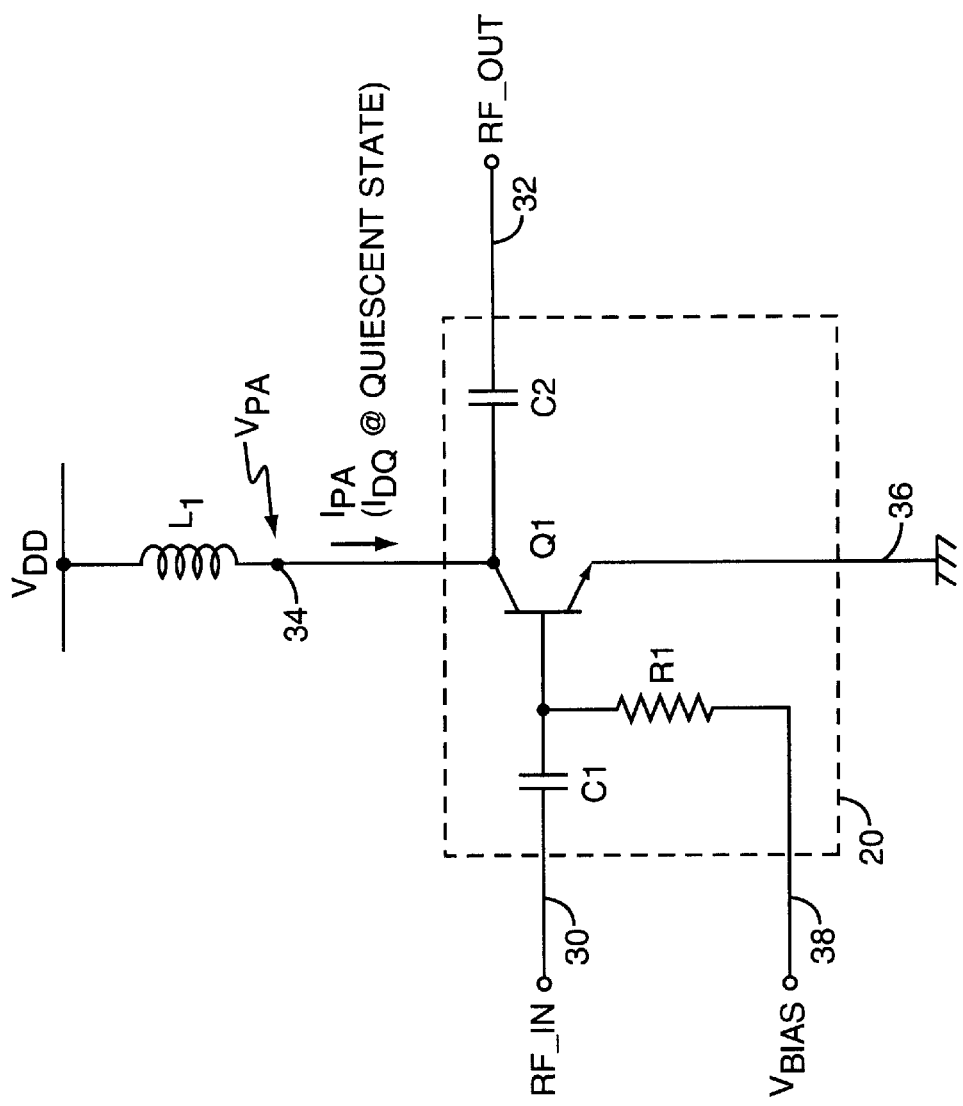
FIG. 3 is a diagram of a single-stage transistor amplifier subject to bias voltage control.

Commonly, the device 10 is required to transmit its RF output signal at a specified transmit power, or at least within a specified range of output powers. The RF output power achievable with a typical power amplifier is determined by its operating point. FIG. 2 is a generic graph of the relationship between input RF power and output RF power as a function of power amplifier operating point. Bias control is used to establish the operating point of a power amplifier, and FIG. 3 illustrates a typical power amplifier circuit arrangement and the mechanism for receiving a bias voltage signal.

For simplification, power amplifier 20 is illustrated as a single stage transistor amplifier comprising transistor Q1 having its collector tied to an input supply terminal 34 which is coupled to a supply voltage $V_{DD}$ through an inductor L1, an emitter tied to signal ground through terminal 36, and a base coupled through R1 to a bias voltage applied to terminal 38. The base is also AC-coupled through capacitor C1 to an RF input signal applied to terminal 30.

In operation, a bias voltage is applied to terminal 38 to establish a quiescent current into the collector of transistor amplifier Q1, thereby establishing the transistor operating point. Application of the RF input signal causes the transistor Q1 to begin self-biasing, but nonetheless the average bias point is maintained by the bias voltage $V_{BIAS}$.

One of the difficulties encountered in proper power amplifier biasing arises from the uncertainties in the relationship between a given bias voltage and a resultant quiescent current. That is, the same bias voltage applied to different specimens of the same type of power amplifier circuit, or applied to the same amplifier at different temperatures produces varying quiescent currents. Table 1 below illustrates output power sensitivity relative to amplifier quiescent current for a typical RF power amplifier.

TABLE 1

| TYPICAL LINEAR PA SPECIFICATIONS | | | |
|---|---|---|---|
| PARAMETER | MIN | TYP | MAX |
| PWR GAIN | 28 dB | 31 dB | 34 dB |
| $I_{DQ}$ | 50 mA | 100 mA | 300 mA |
| ACPR | 26 dBc | 29 dBc | 32 dBc |

As seen from the table data, power gains in a typical power amplifier vary significantly with changes in quiescent current $I_{DQ}$. Moreover, differing quiescent currents varies the operating point of the power amplifier, causing changes in its amplification characteristics (e.g., linearity), which influences the adjacent channel power ratio (ACPR) performance of the power amplifier. ACPR performance is important because of the need to minimize cross-channel interference between the closely spaced communication channel frequencies in a typical wireless communication system.

With the above voltage biasing problems in mind, the reader is referred back to FIG. 1 for an understanding of how these difficulties are addressed in the conventional device 10. In the illustration, one sees that the DSP 14 has access to a look-up table (LUT) or some other similar data structure implemented in a memory 24. Data stored in memory 24 comprise calibration information for needed variations or adjustments of power amplifier bias voltage over temperature, and potentially over time (e.g., drifting due to component aging), and may include multiple sets of data for different operating points, corresponding to different modes of device operation. Indeed, the overall set of variables that influence the resultant quiescent current for a given bias voltage value are complex enough that individualized calibration data is often collected and stored for each device 10. In any case, an undesirable amount of time and labor is expended, often on a per-unit basis, to characterize and store the needed calibration data in memory 24.

Figure 4:
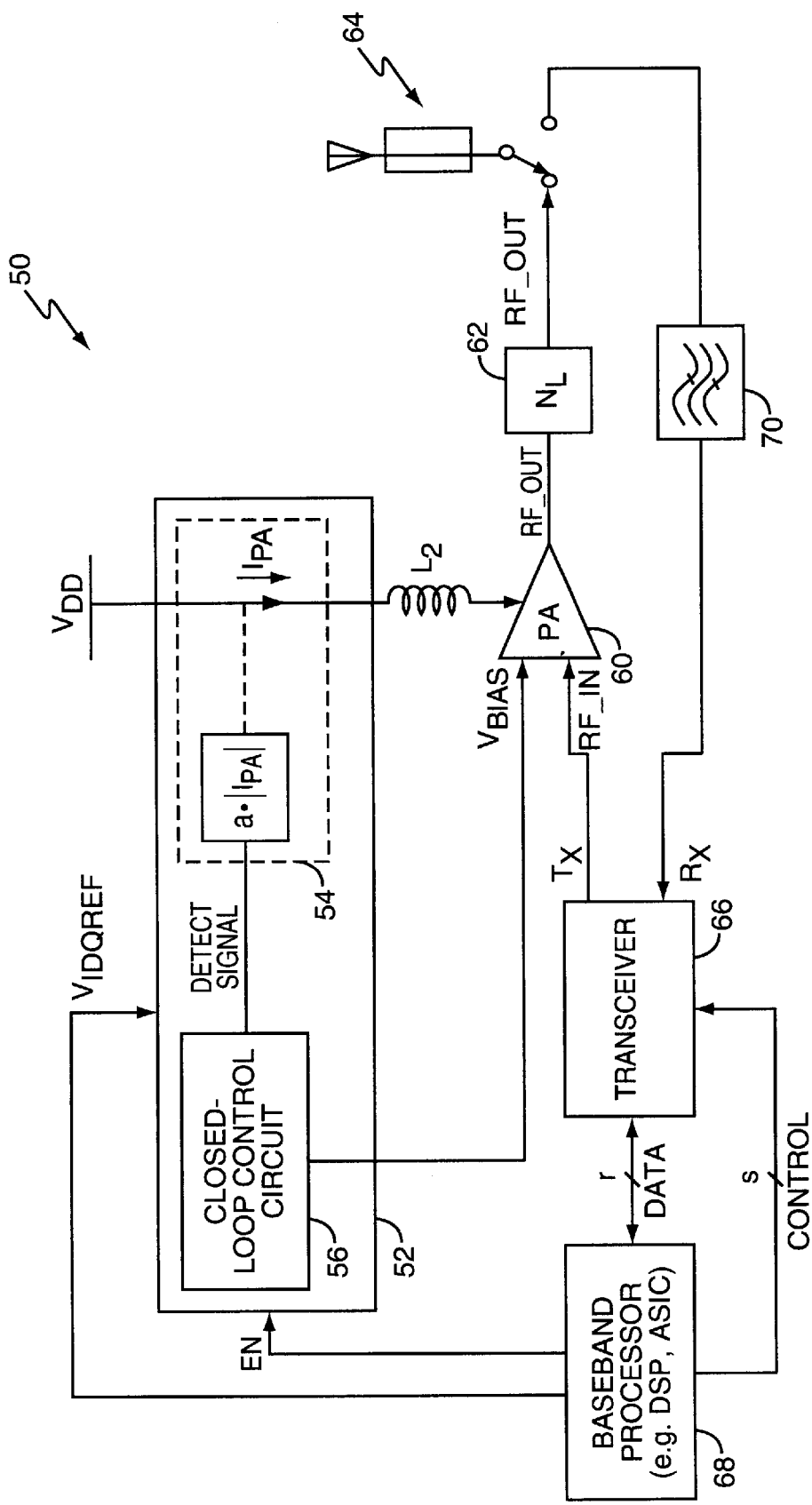
FIG. 4 is a diagram of an exemplary communication device incorporating a bias controller according to the present invention.

FIG. 4 illustrates an exemplary communication device 50 according to the present invention. Here, the communication device 50 includes an exemplary bias controller 52, which comprises a supply current detection circuit 54, and a closed-loop control circuit 56. Device 50 further includes a power amplifier 60, impedance matching network 62, antenna assembly 64, transceiver 66, and baseband processor 68.

In operation, bias controller 52 supplies power amplifier 60 with a bias voltage adjusted to set the quiescent current of power amplifier 60 to a desired quiescent current value. Bias voltage adjustment operations of the bias controller 52 are controlled relative to the transmit operations of device 50, such that bias voltage adjustment is performed under quiescent conditions of the power amplifier 60.

Power amplifier 60 generates a RF output signal (RF_OUT) responsive to an RF input signal (RF_IN) from transceiver 66. The RF_OUT signal is coupled to antenna assembly 64 through the impedance matching network 62, where it is radiated outward as a transmitted signal. The radio transceiver 66 cooperates with baseband processor 68 to generate the RF_IN signal according to desired transmit information, and in accordance with applicable modulation protocols (e.g., IS-136, GSM, or other wireless communication standards).

In terms of bias control, baseband processor 68 cooperates with the bias controller 52 to achieve an adjusted bias voltage level that sets the quiescent current into the power amplifier 60 at a desired target value. In this embodiment, the baseband processor 68 generates, or otherwise controls, a reference voltage $V_{IDQREF}$ that is proportionately representative of the desired quiescent current value. Thus, the baseband processor, which may include digital analog conversion facilities, controls the magnitude of $V_{IDQREF}$ in accordance with the desired quiescent current value. Bias controller 52 uses closed-loop control responsive to $V_{IDQREF}$ and the measured supply current (IPA) into the power amplifier 60 to set the quiescent current level of $I_{PA}$. Once the appropriate adjustment for the bias voltage $V_{BIAS}$ is obtained, the bias controller 52 holds this voltage constant irrespective of any subsequent change in supply current into the power amplifier 60.

More particularly, the bias controller 52 operates in a first state where it dynamically adjusts the bias voltage $V_{BIAS}$ to achieve the desired quiescent current value for the power amplifier supply current $I_{PA}$, and then transitions into a second state where it holds or otherwise maintains the adjusted level of $V_{BIAS}$ irrespective of changes in $I_{PA}$. Transitioning between the first and second states of operation for the bias controller 52 is controlled by enable signal (EN) generated by the baseband processor 68. As will be explained in more detail later, the baseband processor 68 typically asserts the enable signal in advance of radio transmit activity. That is, the EN signal is generally asserted before transmit operations, with the power amplifier held at quiescent conditions (with no applied RF power). The timing function within the bias controller 52 converts the enable signal into a shorter duration control pulse. While the control pulse is asserted, the bias controller 52 operates in the first state by applying closed-loop adjustment to $V_{BIAS}$ to achieve the desired quiescent current value of $I_{PA}$, and upon de-assertion of the pulse, it transitions to the second state where it holds the adjusted level of $V_{BIAS}$.

Figure 5:
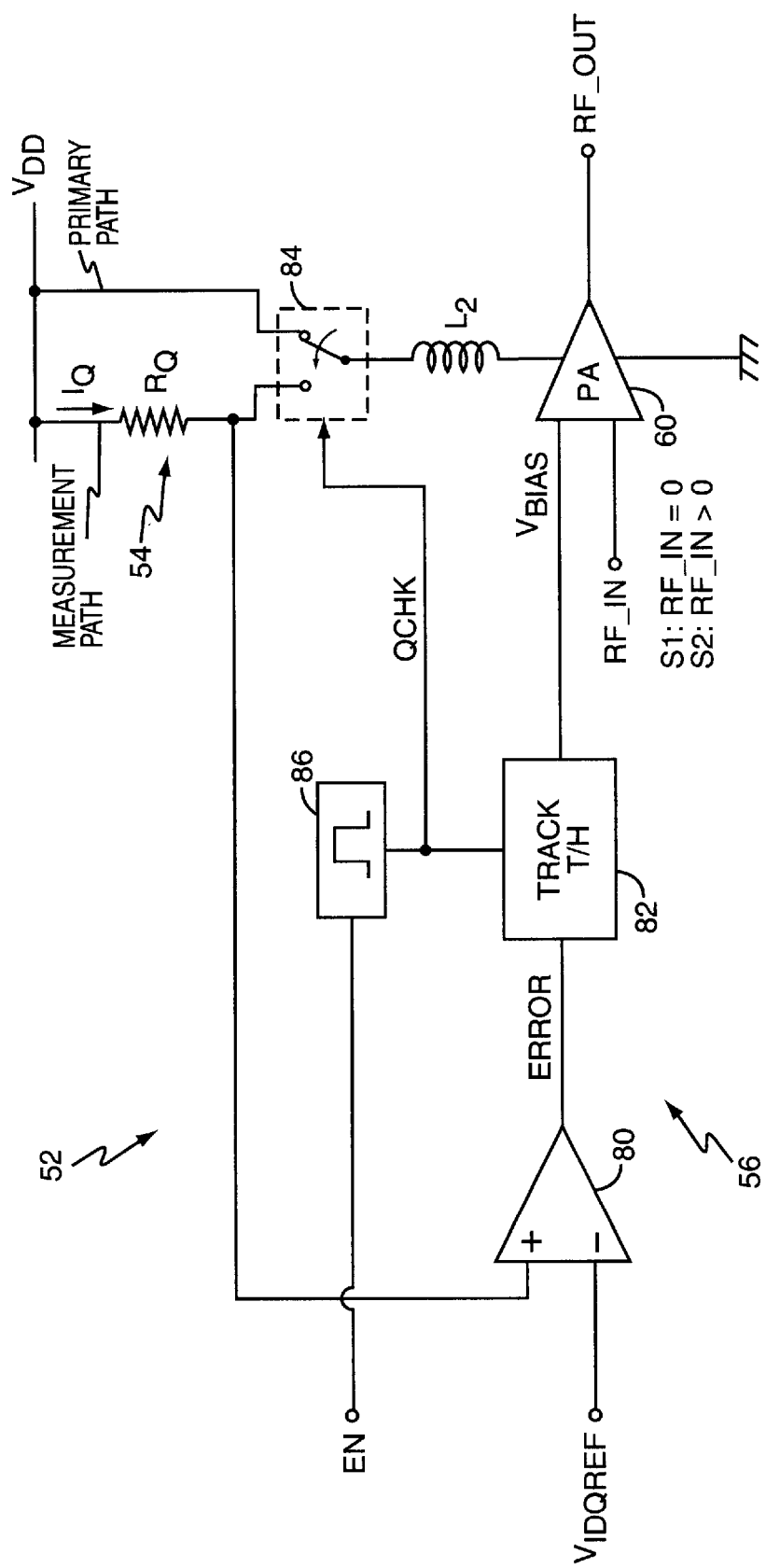
FIG. 5 is a diagram of exemplary details for one embodiment of the bias controller.

FIG. 5 illustrates details for an exemplary embodiment of the bias controller 52. Here, the closed-loop control circuit 56 comprises an amplifier circuit 80 and a track-and-hold circuit 82. The amplifier circuit 80 generates an error signal based on a difference between $V_{IDQREF}$ and the detection signal provided by the current detector 54. In this embodiment, the detection circuit 54 comprises a sense resistor $R_Q$ disposed in series in a measurement path that selectively couples the supply input of the power amplifier 60 to the supply voltage $V_{DD}$ through operation of a switch 84. While switch 84 is drawn as a single-pole, double-throw (SPDT) switch, it should be understood that its implementation might involve the use of separate switches. In any case, supply current $I_{PA}$ to power amplifier 60 may be selectively conducted through either the measurement path or through a primary path by operation of switch 84, which might comprise discrete field effect transistors (FET) disposed in series in the primary and measurement paths.

Regardless of the particular approach taken for selectively enabling the measurement and primary paths, the measurement path is switched in during the adjustment period of operation for the bias controller 52. That is, supply current $I_{PA}$ to the power amplifier 60 flows through the measurement path and therefore flows through the sense resistor $R_Q$ during the adjustment period. Consequently, the detection signal represents a voltage signal that is below the supply voltage $V_{DD}$ by an amount proportionate to the magnitude of supply current $I_{PA}$ flowing into the power amplifier 60 because of the voltage drop caused by that current across the sense resistor $R_Q$. In this manner, the error signal is responsive to the actual level of quiescent current flowing into the power amplifier 60 compared to the desired or target quiescent current value.

A pulse generator 86, which may be a one-shot device, generates the bias calibration control pulse, here labeled as QCHK that drives the path selection switch 84 and the track-and-hold circuit 82. Operation of the track-and-hold circuit 82 in response to the QCHK signal is discussed below.

When the enable signal is asserted, the pulse generator 86 asserts $Q_{CHK}$ for a defined period. While QCHK is asserted, the track-and-hold circuit 82 operates in a tracking mode, and varies the generated bias voltage $V_{BIAS}$ as a function of the error signal output by the amplifier circuit 80. Thus, the bias voltage $V_{BIAS}$ tracks changes in the error signal during the first state of operation to provide closed-loop adjustment of $V_{BIAS}$. Because the magnitude of the bias voltage $V_{BIAS}$ controls the magnitude of supply current $I_{PA}$ into the power amplifier 60, a closed-loop control mechanism is established whereby amplifier circuit 80 drives the error signal either up or down such that the bias voltage $V_{BIAS}$ moves either up or down to minimize the difference between the detection signal and $V_{IDQREF}$. Thus, while in its first state of operation, the bias controller 52 sets the bias voltage $V_{BIAS}$ to whatever level is needed to achieve the desired or target quiescent current value for supply current $I_{PA}$ as represented by the reference voltage $V_{IDQREF}$.

At the conclusion of the defined period, control signal QCHK is de-asserted, and the tracking circuit 82 transitions to its second state where it holds the adjusted level of the bias voltage $V_{BIAS}$. Additionally, switch 84 changes state, thereby coupling the supply input of the power amplifier to the supply voltage $V_{DD}$ through the primary path, thus avoiding the need for sourcing supply current $I_{PA}$ through sense resistor $R_Q$ during normal transmit operations of power amplifier 60.

At this point, the current flowing through the sense resistor $R_Q$ goes to zero and the detection signal rises to the level of the supply voltage $V_{DD}$. While this change in the detection signal causes a potentially large change in the error signal generated by the amplifier circuit 80, the track-and-hold circuit 82 ignores changes in the error signal. Bias voltage $V_{BIAS}$ is thus maintained at the previously adjusted level irrespective of changes in the actual supply current $I_{PA}$ into the power amplifier 60. In this second state, RF input power may be applied to the power amplifier 60 without upsetting or otherwise changing the level of bias voltage provided by the bias controller 52.

Figure 6:
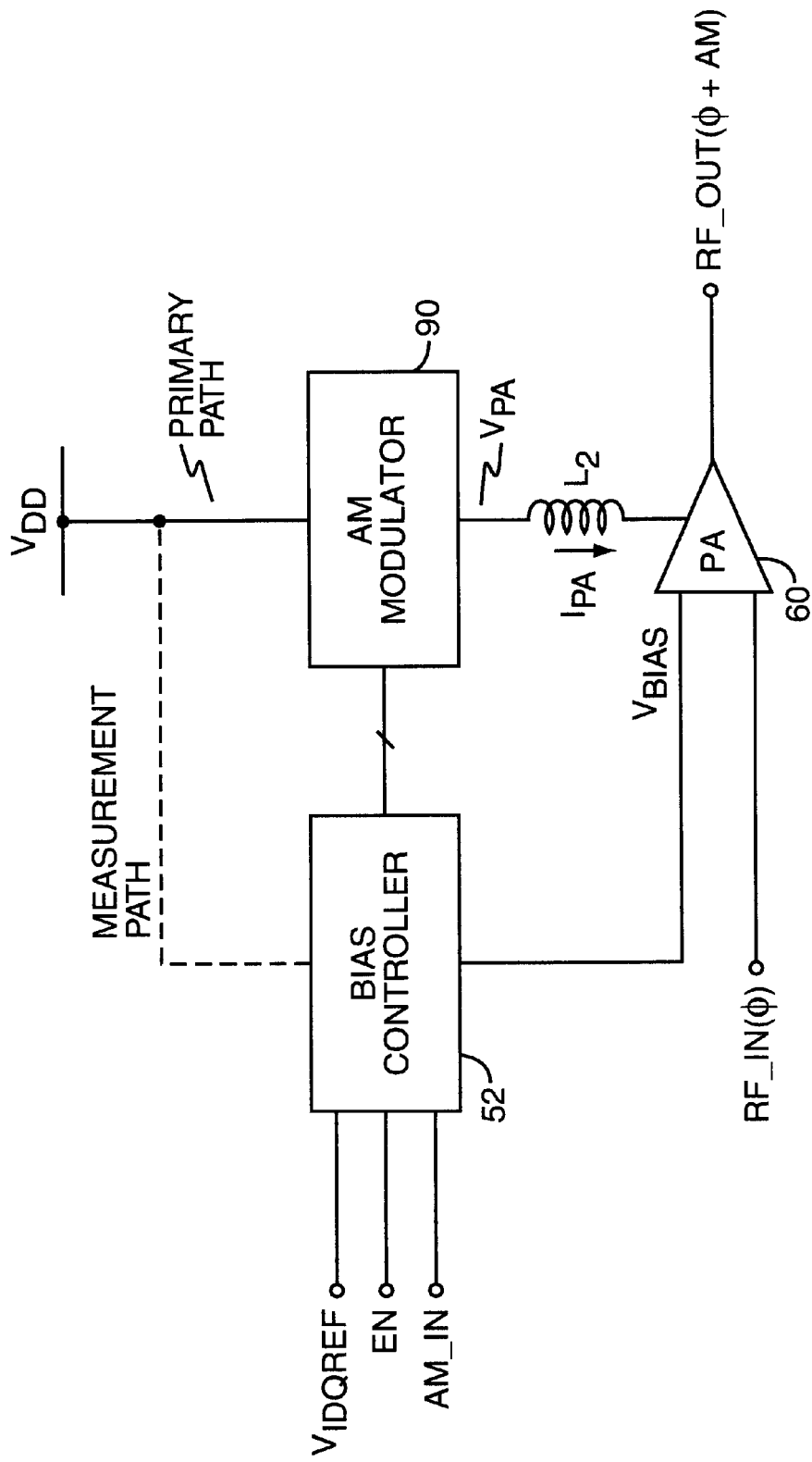
FIG. 6 is a diagram of another embodiment of the bias controller configured to operate in conjunction with a current modulator.

While it was generally assumed in the preceding discussion that the bias controller 52 provided bias voltage to establish a linear point of operation for the power amplifier 60, linear operation is not necessary or even desirable in some applications. FIG. 6 illustrates the power amplifier circuit 60 configured for use in an envelope-elimination-and-restoration (EER) application. Here, the power amplifier circuit 60 is operated as a saturated mode amplifier, and the baseband processor 68 generates separate phase and amplitude modulation waveforms. Thus, the RF_IN signal to the power amplifier 60 comprises a constant envelope phase modulation signal, while the power supply signal from an AM modulator 90 comprises a supply current modulated in accordance with a desired modulation signal AM_IN. Consequently, the RF output signal RF_OUT from the power amplifier circuit contains both phase and amplitude modulation information.

Figure 7A:
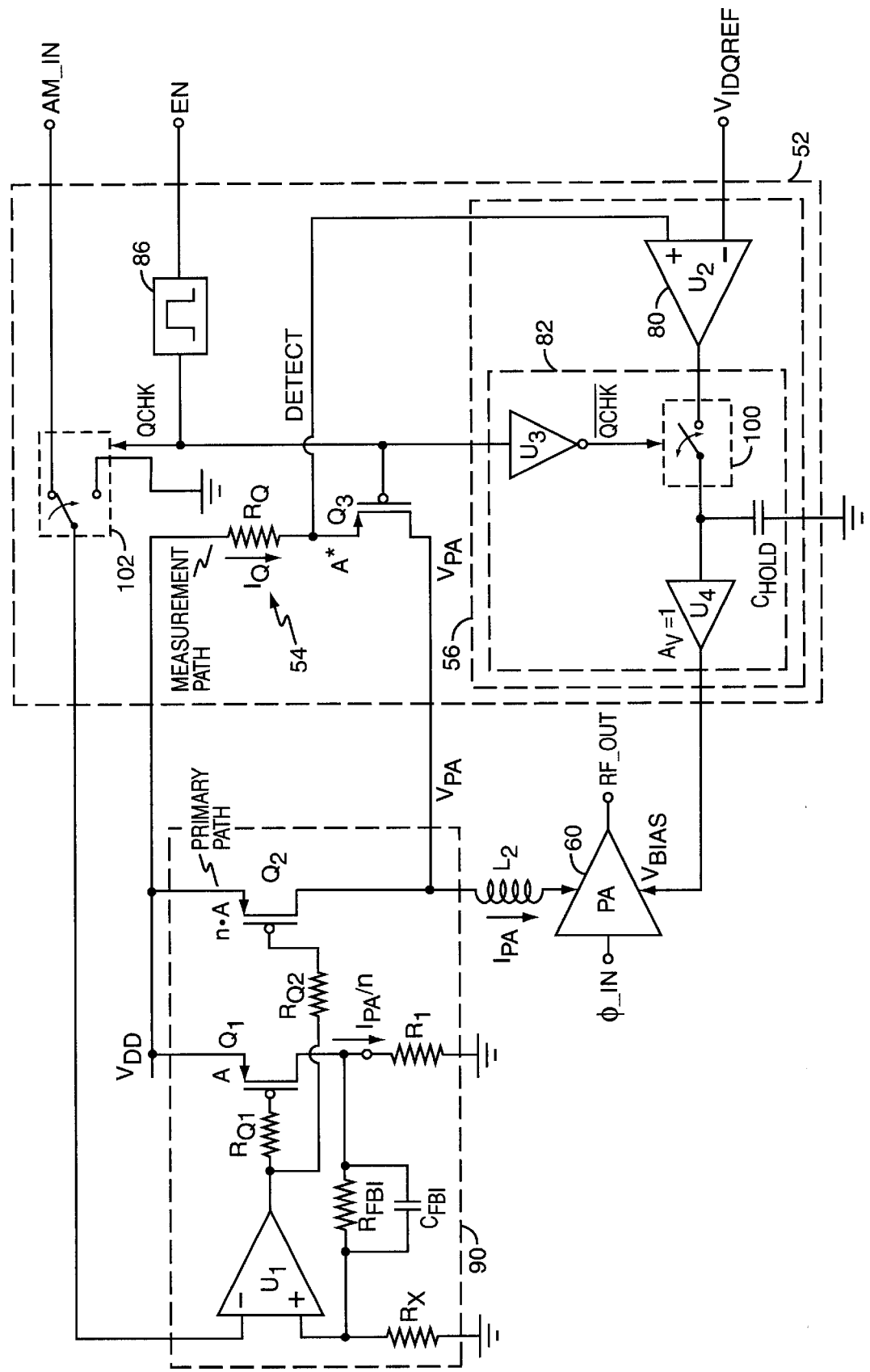
Figure 7B:
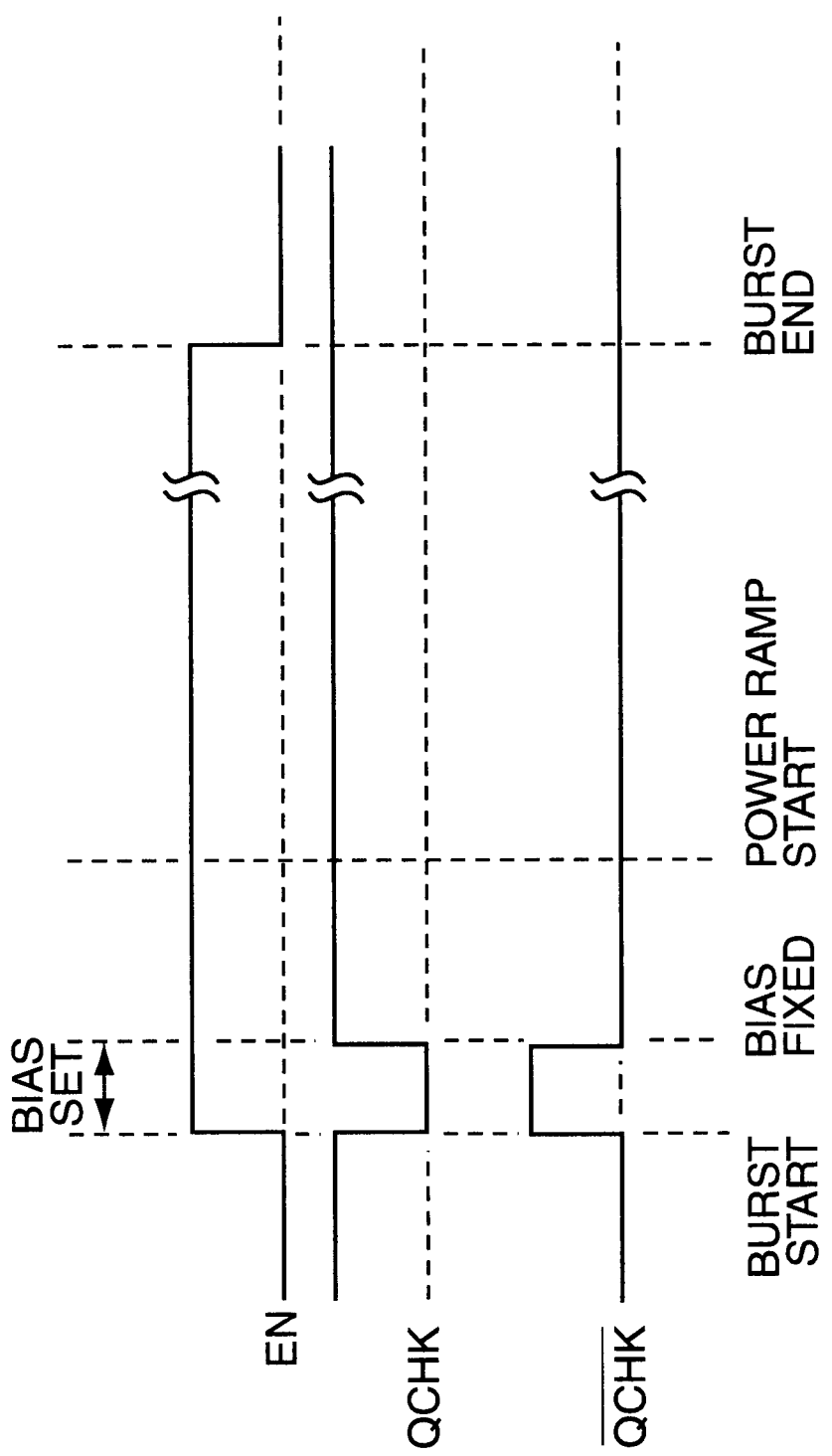
FIG. 7B illustrates exemplary control waveforms associated with timing the operation of the bias controller and current modulator.

Depending upon the particular configuration of the modulator 90, the bias controller 52 may or may not use a measurement path to detect supply current into the power amplifier circuit 60. FIG. 7A illustrates an exemplary embodiment of the modulator 90 and bias controller 52. Referring to FIG. 7B, the enable signal EN is asserted in advance of transmit operations. Upon assertion of the EN signal, the pulse controller 86 of the bias controller 52 generates the QCHK control pulse, which has a defined pulse width that is typically much less (e.g., 15 $\mu$s) than the typical width of the overall enable pulse. Upon assertion of QCHK, irrespective of whether negative or positive logic sense is used, transistor Q3 is turned on thereby enabling supply current $I_{PA}$ to flow through the measurement path which includes the sense resistor $R_Q$ of detector circuit 54. Simultaneously, switch 102 connects the input of differential error amplifier $U_1$ to ground, effectively turning off $Q_1$ and $Q_2$, and disabling the primary path. In this sense, transistor Q3 and switch 102 function together as the selector switch 84 shown in FIG. 5.

QCHK also drives the track-and-hold circuit 82. More specifically, the track-and-hold circuit 82 includes the logic inverter U3 to generate the inverse of QCHK, which inverse signal is used to drive switch 100 that couples a signal input of the track-and-hold circuit 82 to the error signal generated by the error amplifier 80, shown here as U2. When switch 100 is closed, the error signal voltage is impressed on capacitor $C_{HOLD}$, which is coupled to an input of buffer amplifier U4. Thus, in this embodiment, the bias voltage $V_{BIAS}$ represents a buffered version of the error signal voltage impressed on the storage capacitor $C_{HOLD}$. Thus, storage capacitor $C_{HOLD}$ functions as an analog storage element that tracks the error signal voltage during the time that the coupling switch 100 is closed.

At the same time, switch 102, which also forms a part of the bias controller 52 in this embodiment, switches the input of a modulation control amplifier U1 from its default connection with the amplitude modulation signal AM_IN to its bias voltage calibration connection with ground. Switching the inverting input of U1 to ground disables Q1 and Q2, thereby disabling the primary current path into the power amplifier circuit 60, and causing all supply current $I_{PA}$ into the power amplifier 60 to flow through sense resistor $R_Q$ during quiescent conditions, e.g., $I_{PA}=I_Q$.

At the end of the QCHK control pulse, switch 102 decouples the inverting input of U1 from ground and again couples that input to the amplitude modulation signal AM_IN. Likewise, transistor Q3 shuts off thereby disabling the measurement current path. Similarly, switch 100 opens, thereby placing the track- and-hold circuit 82 in its hold condition. Note that use of the buffer amplifier U4 prevents loading of the storage capacitor $C_{HOLD}$ by the bias input of power amplifier 60. That is, the very high input impedance of buffer amplifier U4, in combination with the high input impedance of the open switch 100, results in essentially no discharge of the storage capacitor $C_{HOLD}$ between bias voltage calibration cycles.

Figure 8:
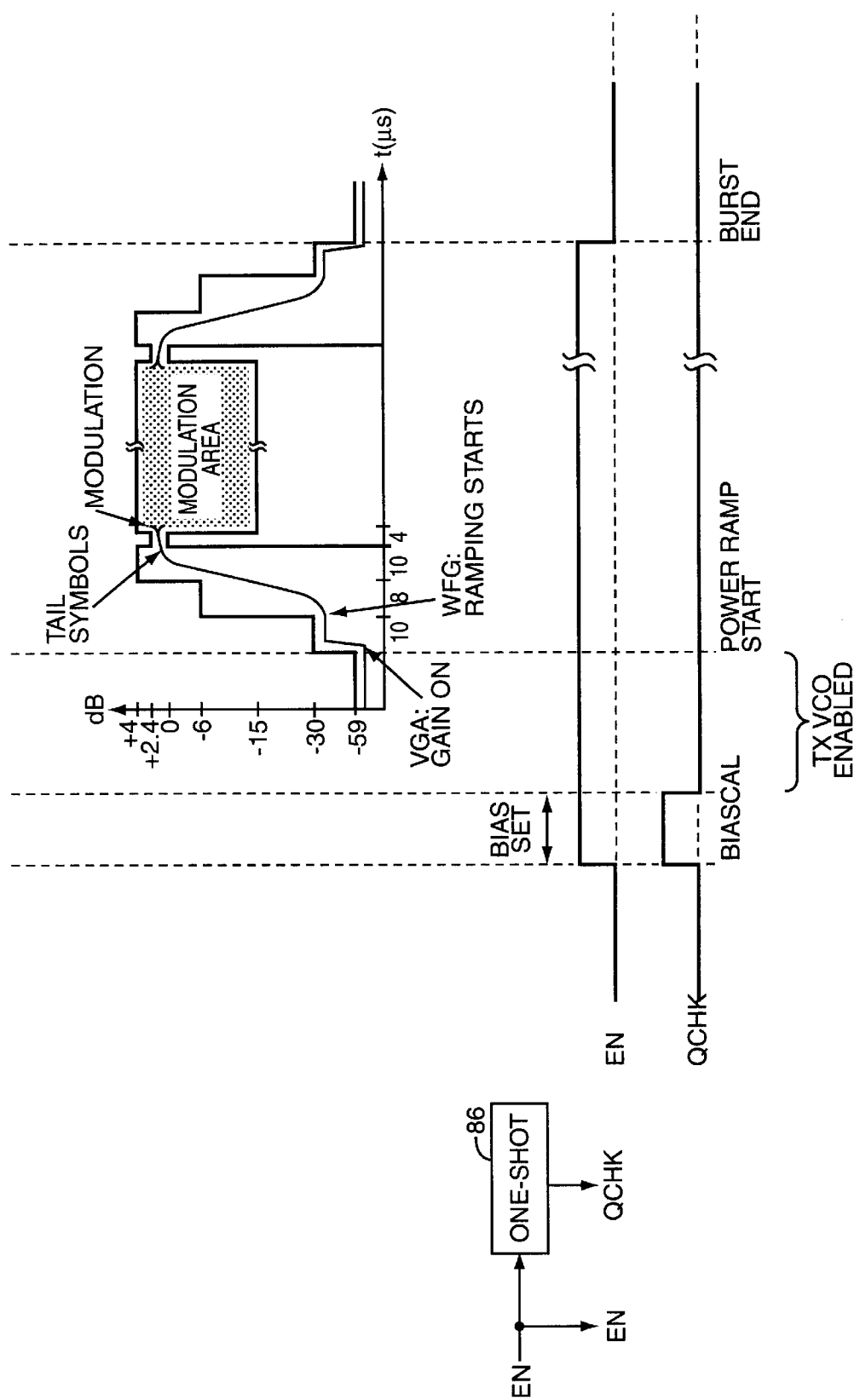
FIG. 8 is a graph of exemplary bias adjustment timing in a radio transmit burst environment, such as that employed in by the GSM communication standards.

FIG. 7B introduced the idea of synchronizing bias voltage calibration operation of the bias controller 52 with radio transmit operations. FIG. 8 provides considerably more detail for such an implementation in the context of a transmit burst as might be used where the device 50 is configured for operation in a wireless communication system based on, for example, the Global Standard for Mobile Communication (GSM).

In GSM, transmit bursts consist of a burst start where the transmit power is ramped up to a defined level, followed by a modulation period, and then terminated by a ramp end where the transmit power falls off in controlled fashion. A power mask envelope defines permissible transmit power during these various portions of the transmit burst.

In typical operation, certain elements or circuits of the communication device 50 are operated in intermittent fashion relative to the transmit bursts to save power. For example, certain portions of the transceiver 66 and perhaps of the baseband processor 68, as well as the bias controller 52 and power amplifier 60, are operated in intermittent fashion synchronized with the required transmit burst. Thus, the enable signal EN may be set to produce an enable pulse width that is somewhat wider than the required transmit burst width, with the initial portion of the EN signal leading the actual start of the transmit burst by a desired amount of time. Thus, the pulse controller 86 can be made to generate a control pulse at the beginning of the much wider enable pulse. This allows the bias controller 52 to calibrate or otherwise adjust the bias voltage $V_{BIAS}$ to the level required to hit the target quiescent current level for the power amplifier circuit 60, and then lock and hold that adjusted bias voltage into and through one or more subsequent transmit bursts.

Figure 9:
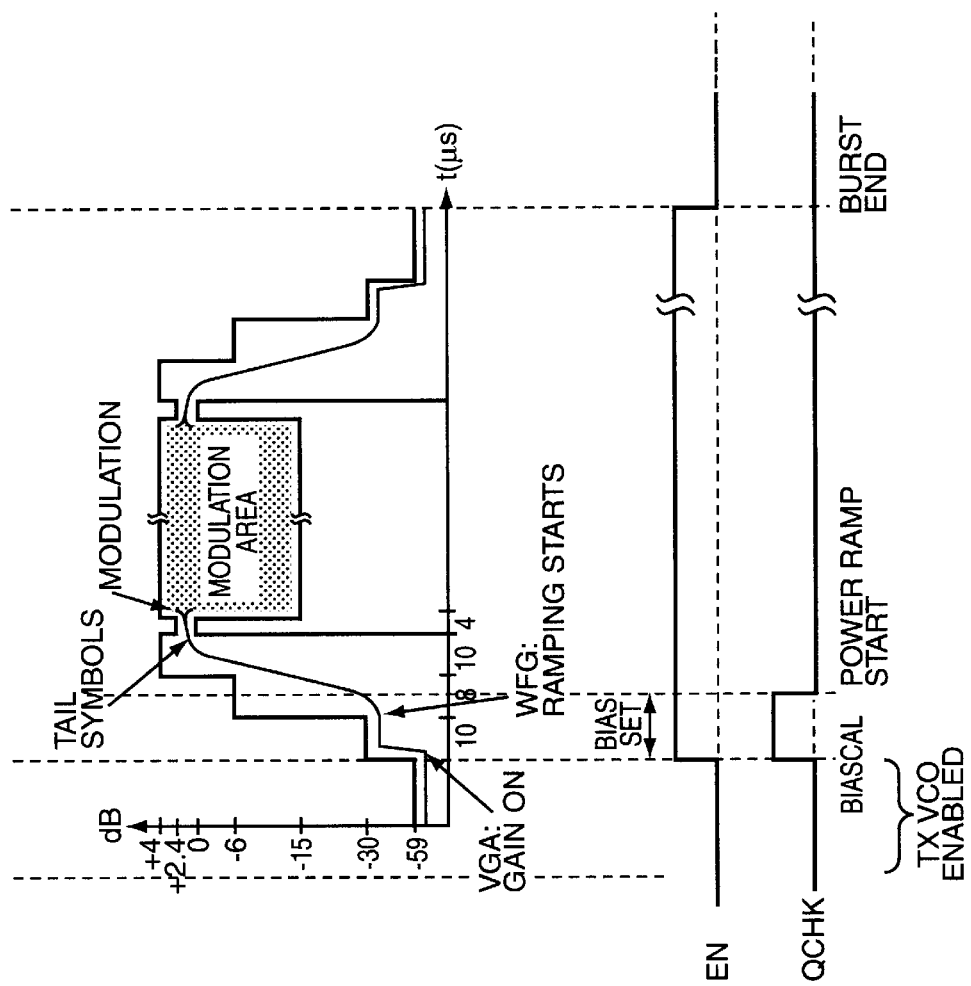
FIG. 9 is graph of alternate bias adjustment timing relative to the burst transmission.

FIG. 9 is similar to FIG. 8 but shows an alternative placement of the bias voltage calibration process relative to the transmit burst. Here, bias calibration is synchronized essentially with the start of the transmit burst, such that bias voltage calibration occurs before the start of actual RF signal modulation, but within the beginning period of the transmit burst. Indeed, the control pulse is configured to occur not at the very beginning of the transmit burst, but at a slightly later point where the allowable transmit power as defined by the transmit power mask is more generous with respect to radiated power from the communication device 50.

One reason for position adjustment operations at that point is that as various portions of the transceiver 66 are powered up, e.g., oscillators, etc., there may be some low-level leakage signal into the RF input of the power amplifier circuit 60. Such leakage might result in greater than allowed RF signal power inadvertently radiating from the device 50 during bias voltage calibration. Thus, moving bias voltage calibration to a point where the transmit power mask allows appreciable radiated power prevents inadvertently violating the power mask limits.

Figure 10:
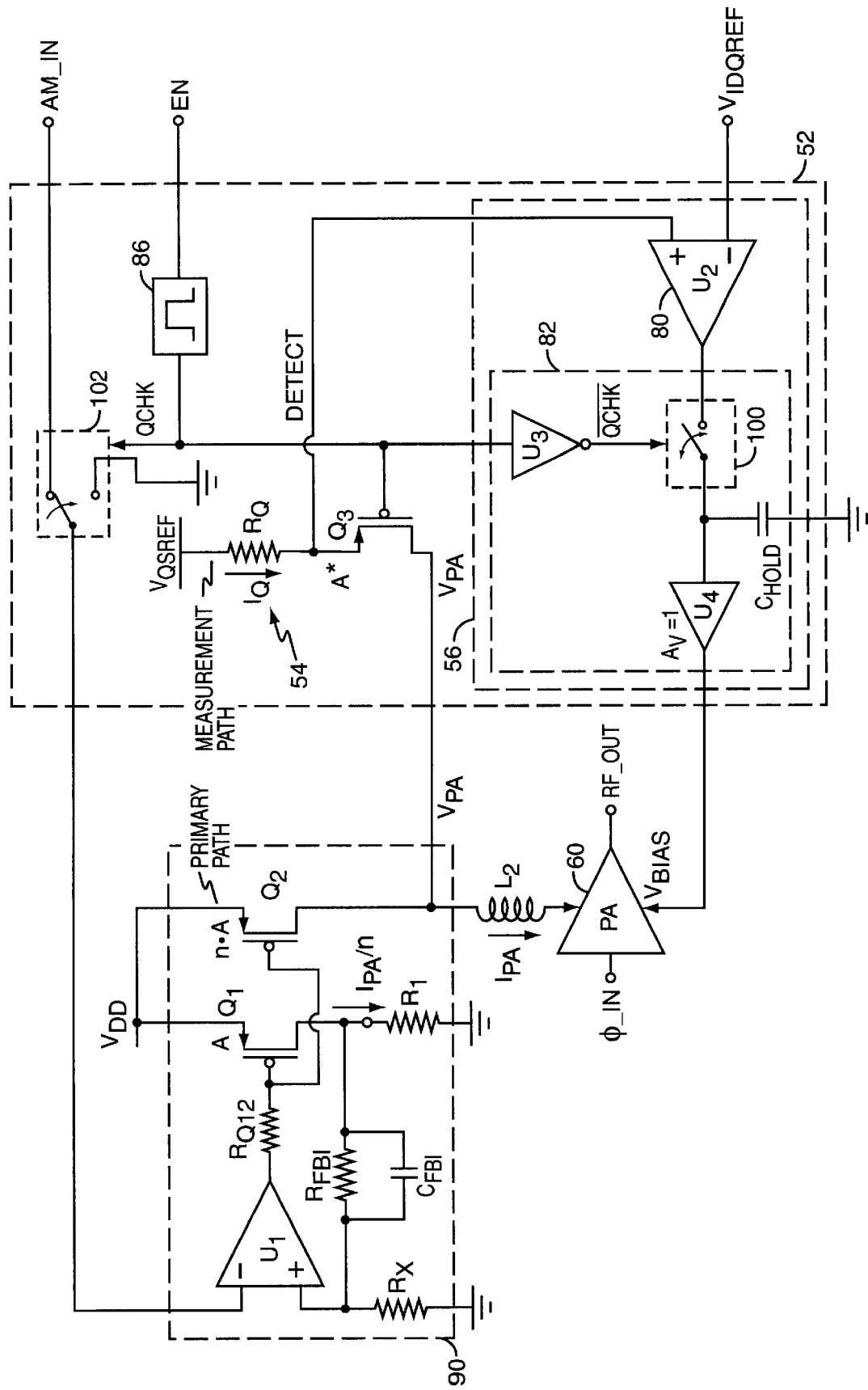
FIG. 10 is a diagram of another embodiment of the bias controller and current modulator where the power amplifier supply voltage used during bias voltage adjustment is independent of the primary supply voltage used during transmit operations.

FIG. 10 illustrates an approach similar to that adopted in FIG. 7A. However, in FIG. 7A the supply current for the power amplifier circuit 60 was sourced from the same supply voltage $V_{DD}$ during both bias voltage calibration and during normal transmit operation. One subtlety associated with conducting bias voltage calibration operations using supply voltage $V_{DD}$ to provide supply current $I_{PA}$ is that $V_{DD}$ is often times simply the direct output of a battery. This is particularly true where communication device 50 comprises a mobile communication device such as a cellular radiotelephone or other type of mobile station. Thus, the magnitude of the supply voltage $V_{DD}$ varies as a function of the state of charge of the battery (not shown). As those skilled in the art will readily appreciate, $V_{DD}$ will exhibit a discharge curve characteristic of the particular battery technology (chemistry) used.

Generally, this poses no difficulties with regard to accurately setting the bias voltage to achieve the desired quiescent current level, but may be undesirable for certain types of power amplifier circuits 60, or for other reasons. In those instances, or as desired, the bias controller 52 may be modified to operate such the supply current $I_{PA}$ during bias adjustment operations is sourced from a different voltage supply than that used during transmit operations.

In an exemplary approach, a reference voltage $V_{QSREF}$ is used to source $I_{PA}$ during bias voltage adjustment. $V_{QSREF}$ may be, for example, a regulated voltage that is derived from the supply voltage $V_{DD}$. No particular requirements dictate a specific design for the supply voltage used during bias voltage adjustment, but it should be noted that the current sourcing capability of whatever circuit is used to provide the reference voltage $V_{QSREF}$ must be sufficient to allow proper bias voltage calibration. For example, depending upon the type of transistor elements within the power amplifier circuit 60, and upon the target output power levels, one might expect typical quiescent current values for $I_{PA}$ to range from 100 milliamps up to and above one Amp depending on the specific design at hand.

Figure 11:
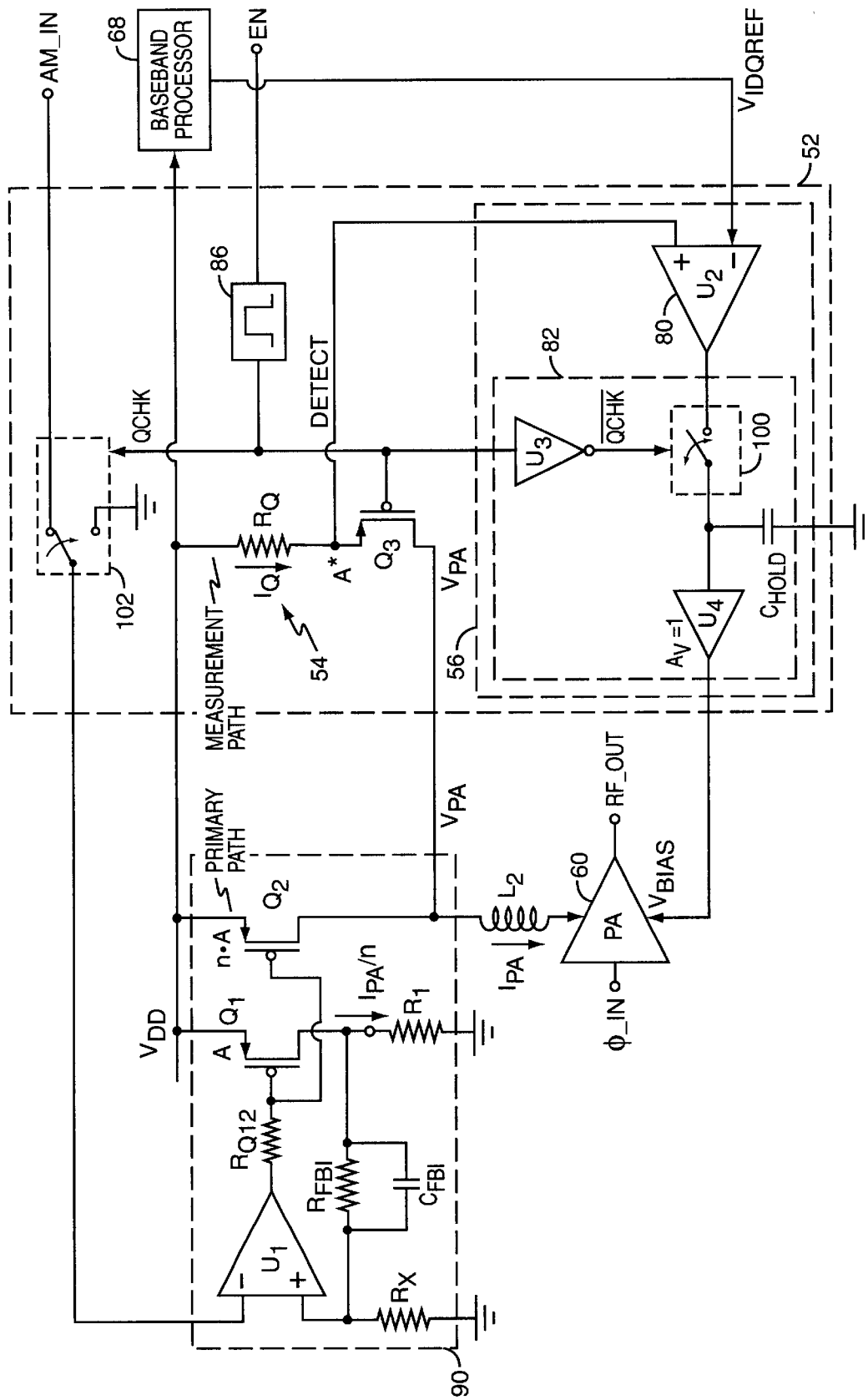
FIG. 11 is a diagram of another embodiment of the bias controller and current modulator where the supply voltage limit is detected and fed to the baseband processor, which then adjusts $V_{IDQREF}$ to compensate for battery voltage variation.

FIG. 11 shows yet another of the many possible approaches to accommodating changing $V_{DD}$ voltage in the bias voltage calibration process. Here, as with FIG. 7A, the source for supply current $I_{PA}$ into the power amplifier 60 under quiescent conditions is the same supply voltage $V_{DD}$ as used for normal transmit operations. However, the baseband processor 68 measures the magnitude of $V_{DD}$ (or a scaled version of $V_{DD}$) and makes any adjustments necessary to the bias voltage reference $V_{IDQREF}$. That is, the reference voltage $V_{IDQREF}$ may be varied as a function of the supply voltage applied to the power amplifier 60 during bias voltage calibration. This approach may be helpful for some types of transistor power amplifiers, where there the quiescent current for a given bias voltage depends on the applied supply voltage. Therefore, with this approach the baseband processor 68 adjusts $V_{IDQREF}$ such that it is always representative of the desired quiescent current value regardless of the changes in the supply voltage $V_{DD}$.

In a related alternative, $V_{QSREF}$ may be generated to have a fixed nominal value, three volts for example, but made responsive to changes in the supply voltage $V_{DD}$. One approach would be to couple $V_{QSREF}$ through a voltage divider (e.g., a resistive voltage divider) such that a fraction of $V_{DD}$ is applied to $V_{QSREF}$. In that manner, the fractional component of $Q_{QSREF}$ determined by $V_{DD}$ would vary with $V_{DD}$.

Whether or not any of the above approaches, or variations thereof, are adopted, one should ensure that the calibration supply voltage applied to the power amplifier 60 is sufficient to ensure proper operation. Further, if different supply voltages are used between bias voltage calibration and normal operation, one should ensure that the calibration supply voltage is sufficiently close to the normal supply voltage of the power amplifier 60 to prevent shifts in quiescent current when the power amplifier 60 is switched from the calibration supply voltage to the normal supply voltage.

As control of the quiescent current reference voltage $V_{IDQREF}$ is subject to several different approaches, including the $V_{DD}$-dependent control aspects above, so too are other aspects of bias control operation subject to much variation. For example, the detection circuit 54 may sense or otherwise measure supply current IPA flowing through either the measurement or primary supply paths, but also might measure a reference current that is slaved or otherwise made to vary in proportion with the actual power amplifier supply current. For an example of this, the reader is referred to the co-pending and commonly assigned application entitled, "CURRENT MODULATOR WITH DYNAMIC AMPLIFIER IMPEDANCE COMPENSATION," and which is incorporated herein by reference in its entirety. In the co-pending application, a reference current is held at a known proportion to the actual power amplifier supply current, and the bias controller 52 may measure the actual power amplifier supply current by sensing the magnitude of that reference current. Those skilled in the art will readily appreciate that measuring power amplifier supply current for closed-loop bias voltage adjustment may be accomplished directly or indirectly in a variety of ways.

While the above details relate to exemplary embodiments of the present invention, those skilled in the art will understand that it is not limited to those details. In general, the present invention provides a bias controller that provides dynamic calibration of bias voltage to set a desired quiescent current value of power amplifier supply current in advance of radio transmit operations. Such bias voltage adjustment uses closed-loop control such that the bias voltage needed for the desired quiescent current is automatically set regardless of variations in circuit parameters or temperature, or device aging. Therefore, the present invention is limited only by the scope of the following claims, and the reasonable equivalents thereof.

What is claimed is:

1. A bias controller to generate a bias voltage signal that sets a quiescent current value of a supply current into a power amplifier circuit, the bias controller comprising:
   a current detector to generate a detection signal responsive to the supply current; and
   a closed-loop control circuit to adjust the bias voltage responsive to the detection signal in a first state such that supply current is set substantially equal to a desired quiescent current value, and to maintain the bias voltage during a second state irrespective of the detection signal.

2. The bias controller of claim 1, wherein the closed-loop control circuit comprises:
an amplifier circuit to generate an error signal responsive to a difference between the detection signal and a reference signal representative of the desired quiescent current value; and
a track-and-hold circuit to generate the bias voltage as a function of the error signal in the first state, and to maintain the bias voltage irrespective of the error signal in the second state.

3. The bias controller of claim 2, wherein the track-and-hold circuit comprises:
an input storage element coupled to an output of the amplifier circuit in the first state and decoupled in the second state, such that the input storage element tracks the error signal in the first state and holds a last value of the error signal in the second state; and
a buffer amplifier coupled to the input storage element to generate the bias voltage based on the error signal in the first state, and based on the last value of the error signal in the second state.

4. The bias controller of claim 3, wherein the buffer amplifier comprises a voltage follower circuit with a desired signal gain.

5. The bias controller of claim 4, wherein the buffer amplifier comprises a unity-gain voltage follower.

6. The bias controller of claim 4, wherein the track-and-hold circuit further comprises a coupling switch to selectively couple and decouple the input storage element from the error amplifier responsive to a bias adjust control signal.

7. The bias controller of claim 6, wherein the input storage element comprises a capacitor coupled at a first end to the coupling switch and to an input of the buffer amplifier, and coupled to a signal ground node at a second end, such that a capacitor voltage of the capacitor follows the error signal when coupled to the error amplifier, and remains substantially at the last value of the error signal when decoupled from the error amplifier.

8. The bias controller of claim 1, wherein a supply input of the power amplifier is coupled to a first supply voltage through a measurement path including the current detector, and to a second voltage supply through a primary path bypassing the current detector, and wherein the bias controller further includes at least one switch to enable the measurement path in the first state, and to enable the primary path in the second state.

9. The bias controller of claim 8, wherein the first voltage supply is the same as the second voltage supply.

10. The bias controller of claim 8, wherein the first voltage supply is a regulated voltage supply derived from the second voltage supply.

11. The bias controller of claim 8, wherein at least one switch comprises a first switch to enable supply current flow through the measurement path in the first state, and to block supply current flow through the measurement path in the second state.

12. The bias controller of claim 11, wherein the current detector comprises a sense resistor coupled to at a first end to the second supply voltage, and coupled at a second end to a first terminal of the first switch, and wherein a second terminal of the first switch is coupled to the supply input of the power amplifier circuit.

13. The bias controller of claim 11, wherein the at least one switch further comprises a second switch to disable supply current flow through the primary path in the first state, and to enable supply current flow through the primary path in the second state, such that the supply current into the power amplifier circuit does not flow through the sense resistor in the second state.

14. The bias controller of claim 1, further comprising a one-shot circuit to generate a state control pulse responsive to an enable signal, such that the bias controller operates in the first state during assertion of the state control pulse, and operates in the second state when the state control pulse is de-asserted.

15. The bias controller of claim 2, wherein the closed loop control circuit further comprises an adjustment circuit to adjust the reference signal dependent on changes in the supply voltage.

16. The bias controller of claim 15 wherein the adjustment circuit detects the supply current and generates the reference signal responsive to the detected supply voltage.

17. The bias controller of claim 16 wherein the adjustment circuit comprises a digital signal processor.

18. The bias controller of claim 15 wherein the adjustment circuit comprises a resistive divider circuit.

19. A current modulator comprising:
an output circuit to modulate a supply current responsive to an amplitude modulation signal;
a bias controller comprising:
a current detector to generate a detection signal responsive to the supply current during quiescent conditions; and
a closed-loop control circuit to adjust the bias voltage responsive to the detection signal in a first state such that supply current is set substantially equal to a desired quiescent current value, and to maintain the bias voltage during a second state irrespective of the detection signal.

20. The current modulator of claim 19, wherein the modulation signal is inactive in the first state and active in the second state, such that the bias controller adjusts the bias voltage in the absence of the modulation signal.

21. The current modulator of claim 20, wherein the current modulator provides the supply current to the power amplifier circuit as a scaled version of a reference current, and wherein the current detector of the bias controller comprises a sense resistor disposed in series in a reference current path of the current modulator.

22. The current modulator of claim 20, further comprising a modulation input switch that couples a modulation input of the current modulator to the modulation signal in the second state, and to a reference voltage in the first state such that adjustment of the bias voltage occurs with a supply input of the power amplifier circuit set by the reference voltage.

23. The current modulator of claim 19, wherein the closed-loop control circuit comprises:
an amplifier circuit to generate an error signal responsive to a difference between the detection signal and a reference signal representative of the desired quiescent current value; and
a track-and-hold circuit to generate the bias voltage as a function of the error signal in the first state, and to maintain the bias voltage irrespective of the error signal in the second state.

24. The current modulator of claim 23 wherein the track-and-hold circuit comprises:
an input storage element coupled to an output of the amplifier circuit in the first state and decoupled in the second state, such that the input storage element tracks the error signal in the first state and holds a last value of the error signal in the second state; and a buffer amplifier coupled to the input storage element to generate the bias voltage based on the error signal in the first state, and based on the last value of the error signal in the second state.

25. The current modulator of claim 24, wherein the buffer amplifier comprises a voltage follower circuit with a desired signal gain.

26. The current modulator of claim 25, wherein the buffer amplifier comprises a unity-gain voltage follower.

27. The current modulator of claim 25, wherein the track-and-hold circuit further comprises a coupling switch to selectively couple and decouple the input storage element from the error amplifier responsive to a bias adjust control signal.

28. The current modulator of claim 27, wherein the input storage element comprises a capacitor coupled at a first end to the coupling switch and to an input of the buffer amplifier, and coupled to a signal ground node at a second end, such that a capacitor voltage of the capacitor follows the error signal when coupled to the error amplifier, and remains substantially at the last value of the error signal when decoupled from the error amplifier.

29. The current modulator of claim 19, wherein a supply input of the power amplifier is coupled to a first supply voltage through a measurement path including the current detector, and to a second voltage supply through a primary path bypassing the current detector, and wherein the bias controller further includes at least one switch to enable the measurement path in the first state, and to enable the primary path in the second state.

30. The current modulator of claim 29, wherein the first voltage supply is the same as the second voltage supply.

31. The bias controller of claim 29, wherein the first voltage supply is a regulated voltage supply derived from the second voltage supply.

32. The current modulator of claim 29, wherein at least one switch comprises a first switch to enable supply current flow through the measurement path in the first state, and to block supply current flow through the measurement path in the second state.

33. The current modulator of claim 32, wherein the current detector comprises a sense resistor coupled to at a first end to the second supply voltage, and coupled at a second end to a first terminal of the first switch, and wherein a second terminal of the first switch is coupled to the supply input of the power amplifier circuit.

34. The current modulator of claim 32, wherein the at least one switch further comprises a second switch to disable supply current flow through the primary path in the first state, and to enable supply current flow through the primary path in the second state, such that the supply current into the power amplifier circuit does not flow through the sense resistor in the second state.

35. The current modulator of claim 19, further comprising a one-shot circuit to generate a state control pulse responsive to an enable signal, such that the bias controller operates in the first state during assertion of the state control pulse, and operates in the second state when the state control pulse is de-asserted.

36. The current modulator of claim 23, wherein the closed loop control circuit further comprises an adjustment circuit to detect a battery voltage and to adjust the reference voltage dependent on changes in the battery voltage.

37. The current modulator of claim 36 wherein the adjustment circuit comprises a digital signal processor.

38. The current modulator of claim 36 wherein the adjustment circuit comprises a resistive divider circuit.

39. A method of controlling a bias voltage signal that sets a quiescent current value of supply current to a power amplifier circuit, the method comprising:

detecting the supply current into the power amplifier circuit in a first state of operation;

adjusting the bias voltage during the first state of operation until the supply current substantially equals a desired quiescent current value;

maintaining the bias voltage during a second state of operation irrespective of the supply current.

40. The method of claim 39, wherein the first state of operation corresponds to a quiescent period of operation for the power amplifier circuit, and the second state of operation corresponds to an active period of operation for the power amplifier circuit.

41. The method of claim 39, wherein detecting the supply current into the power amplifier circuit in a first state of operation comprises:

coupling a supply input of the power amplifier circuit to a first voltage supply through a measurement path including a sense resistor; and generating a detection signal proportionate to the supply current across the sense resistor.

42. The method of claim 41, wherein adjusting the bias voltage during the first state of operation until the supply current substantially equals a desired quiescent current value comprises:

generating an error signal based on the difference between the detection signal and a reference signal representing the desired quiescent current value; and adjusting the bias voltage as a function of the error signal.

43. The method of claim 41, further comprising coupling the supply input of the power amplifier circuit to a second voltage supply through a primary path that bypasses the current sensor during the second state of operation.

44. The method of claim 39, wherein the supply current is provided to the power amplifier circuit as a scaled version of a reference current, and wherein detecting the supply current into the power amplifier circuit in a first state of operation comprises:

detecting the reference current; and inferring a value of the supply current based on a known current scaling between the reference and supply currents.

45. The method of claim 44, wherein detecting the reference current comprises measuring a voltage drop across a sense resistor placed in series with the reference current.

46. The method of claim 39, further comprising applying substantially the same magnitude of supply voltage to the power amplifier circuit during the first and second states of operation to reduce quiescent current errors arising from variations in supply voltage between the first and second states of operation.

47. The method of claim 39, wherein the power amplifier circuit is a type of bipolar junction transistor circuit having a known Vce curve, and further comprising applying a voltage supply having a magnitude corresponding to a relatively flat portion of the Vce curve to the power amplifier circuit during the first state of operation.

48. The method of claim 39, further comprising controlling the first and second states of operation such that the first state of operation is a first period before a transmit signal is applied to the power amplifier circuit for amplification, and the second state of operation is a second period that includes amplification of the transmit signal by the power amplifier circuit.

49. The method of claim 48, further comprising timing the first period to occur in advance of a GSM transmit burst, and timing the second period to extend through the GSM transmit burst.

50. The method of claim 48, further comprising timing the first period to occur within a GSM burst time but before a pre-amplified burst signal is applied to the power amplifier circuit for amplification.

51. The method of claim 50, wherein the first period is positioned within the GSM burst time to occur after the initial transmit power mask level time has expired.

52. The method of claim 39, wherein adjusting the bias voltage during the first state of operation until the supply current substantially equals a desired quiescent current value comprises closing a control loop that sets the bias voltage based on a difference between the supply current and the desired quiescent current value.

53. The method of claim 52, wherein closing a control loop comprises:
   generating an error signal with a difference amplifier coupled to a reference signal representing the desired quiescent current level, and coupled to a detection signal proportional to the supply current; and
   adjusting the bias voltage as a function of the error signal.

54. The method of claim 39, wherein maintaining the bias voltage during a second state of operation irrespective of the detected supply current comprises storing the bias voltage set during the first state in an analog storage element.

55. The method of claim 54 further comprising adjusting the reference signal as a function of the supply voltage.

56. The method of claim 55 wherein adjusting the reference signal as a function of the supply voltage comprises detecting the supply voltage and adjusting the reference signal responsive to the detected supply voltage.

57. The method of claim 56 wherein detecting the supply voltage and adjusting the reference signal responsive to the detected supply voltage is performed by a digital signal processor.

58. The method of claim 55 adjusting the reference signal as a function of the supply voltage comprises dividing the supply voltage in a resistive divider to generate the reference signal such that changes in the supply voltage result in corresponding changes in the reference signal.

* * * * *